United States Patent
Mori et al.

[11] Patent Number: 5,534,996
[45] Date of Patent: Jul. 9, 1996

[54] MEASUREMENT APPARATUS FOR EVALUATING CHARACTERISTICS OF LIGHT EMITTING DEVICES

[75] Inventors: Hiroshi Mori, Ohizumi-machi; Masatoshi Bendo, Gunma-ken, both of Japan

[73] Assignee: Advantest Corporation, Tokyo, Japan

[21] Appl. No.: 309,904

[22] Filed: Sep. 21, 1994

[30] Foreign Application Priority Data

| Sep. 21, 1993 | [JP] | Japan | 5-257622 |
| Sep. 21, 1993 | [JP] | Japan | 5-257623 |
| Sep. 30, 1993 | [JP] | Japan | 5-057924 U |

[51] Int. Cl.$^6$ .................................................. G01J 1/42
[52] U.S. Cl. .......................... 356/218; 356/226; 356/227; 359/110
[58] Field of Search .................. 359/110; 356/218, 356/226, 227

[56] References Cited

U.S. PATENT DOCUMENTS

| 4,220,412 | 9/1980 | Shroyer et al. | 356/218 |
| 4,289,399 | 9/1981 | Uchida | 356/218 |
| 4,556,875 | 12/1985 | Ishiwatari | 359/110 |
| 4,643,568 | 2/1987 | Forsberg | 356/218 |
| 5,037,198 | 8/1991 | Gaboury | 356/226 |
| 5,087,808 | 2/1992 | Reed | 356/227 |
| 5,278,688 | 1/1994 | Blauvelt et al. | 359/110 |
| 5,295,015 | 3/1994 | Yoneyama | 359/110 |
| 5,349,458 | 9/1994 | Karlsson | 359/110 |

*Primary Examiner*—Frank Gonzalez
*Assistant Examiner*—Jason D. Eisenberg
*Attorney, Agent, or Firm*—Knobbe, Martens, Olson & Bear

[57] ABSTRACT

A measurement apparatus and method for evaluating a light emitting device automatically measures a carrier-noise ratio, an optical modulation index, and a relative intensity noise of the light emitting device, and graphically displays the resulted data. The measurement apparatus includes a photo detector for converting an input light signal from the light emitting device to an electric current, a DC amplifier for amplifying a DC component of the electric current, a first analog-to-digital convertor for digitizing the output of the DC amplifier, a RF amplifier for amplifying a high frequency component of the electric current, a detector for detecting the output of the RF amplifier, a second analog-to-digital convertor for digitizing the output of the detector, a controller for controlling sequences of automatic measuring operations, a display device for displaying the characteristics of the light emitting device.

6 Claims, 6 Drawing Sheets

Optical modulation index characteristic

C/N characteristic

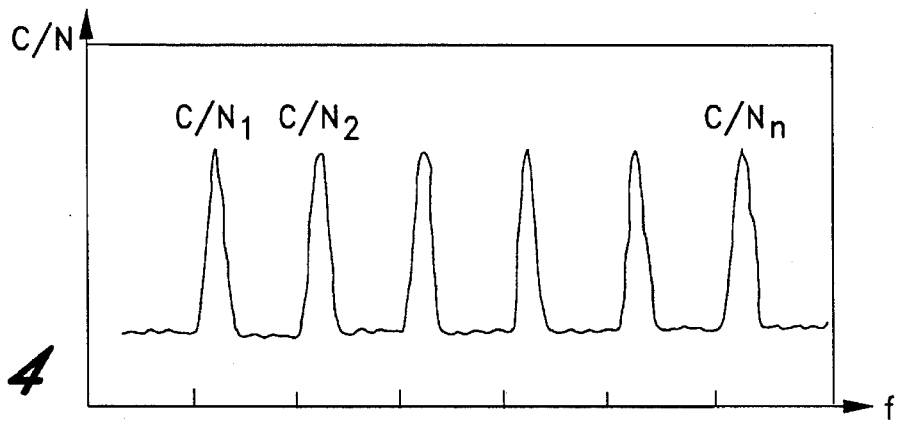
Fig. 4
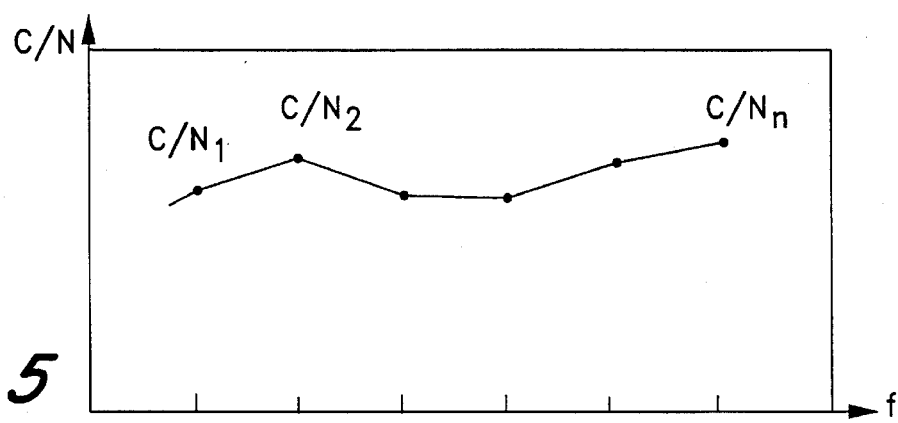
Fig. 5
Fig. 6a
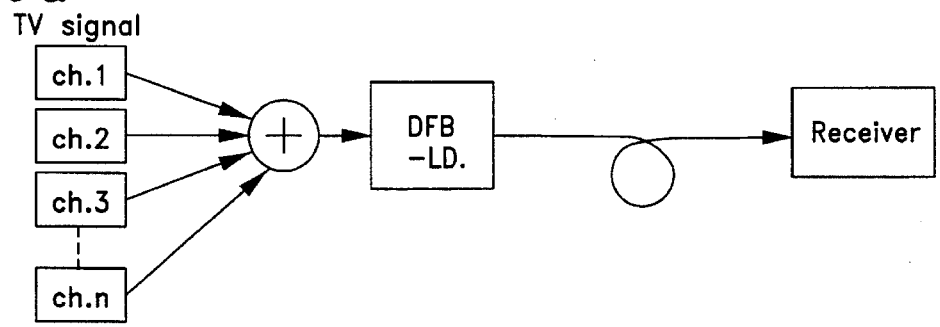
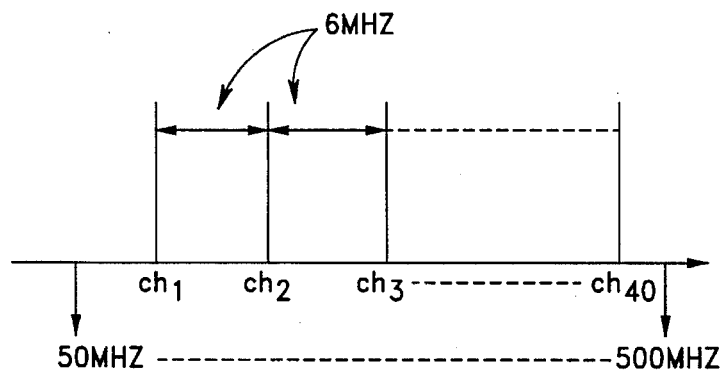
Fig. 6b

MEASUREMENT APPARATUS FOR EVALUATING CHARACTERISTICS OF LIGHT EMITTING DEVICES

BACKGROUND OF THE INVENTION

The present invention relates to a measurement apparatus and method for measuring characteristics of light emitting devices, especially of laser diodes used in an optical CATV equipment. In particular, the invention relates to an apparatus and method for automatically measuring a carrier-to-noise ratio, an optical modulation index, and a relative intensity noise of the laser diode.

Nowadays, the needs to evaluate characteristics of laser diodes used in an optical communication system, especially in an optical CATV (cable television) equipment have increased. The needs include to evaluate the laser diodes precisely, easily, and quickly, in conformity with each application. The reasons for these need include that, in an optical CATV equipment and in an optical fiber transmission media, multiplexed communication method tends to be used by incorporating optically modulated multichannel scheme, and thus, it becomes more important to guarantee the quality of audio and video data for all of the channels to subscribers.

Consequently, it is important for both manufacturers of the laser diodes and providers of the CATV equipment using the laser diodes, to precisely evaluate the characteristics of the laser diodes. But in reality, parameters are measured one-by-one separately by two or more measurement apparatus and the characteristics of the laser diode are obtained by calculating these measured parameters. Although some CATV systems have 40 channels or more in the frequency range of 50 to 500 MHz, at present, there is no single measurement apparatus and method that can automatically measure characteristic of these channels precisely, easily, within a short period of time.

FIG. 6 is a conceptual diagram of such an optical CATV multiplexed communication system. In FIG. 6, a plurality of channels, for example, TV channels, are mixed in a mixer whose output is connected to a laser diode. The light signal of the laser diode is modulated by TV signals and transmitted through a glass fiber to a receiver.

As technologies in such communication systems advance, the optical CATV multiplexed communication system incorporates more communication channels. Thus, it is necessary to improve test throughput for evaluating laser diodes for use in the CATV systems. One of the important laser diode characteristics is a relative intensity noise (RIN) in which a noise component of light emitted by a laser diode is evaluated with respect to an average light power of the laser diode.

In the prior art, the RIN is measured by the process as follows. First, the light signal from a laser diode is detected by a photo detector and the noise component in the light signal is measured by a measurement apparatus. Next, the average power of the light signal is measured by another measurement apparatus. Finally, the RIN is obtained by calculating these measured data and compensating the difference in the absolute value between the two measurement apparatus.

FIG. 12 is a block diagram showing an example of conventional arrangement for measuring the RIN. In FIG. 12, the light signal from a laser diode (not shown) is converted to an electric signal by a photo detector 201. The noise component is passed through a bias tee 202, amplified by an amplifier 204 with gain G, and measured by a spectrum analyzer 205. On the other hand, the average power of the light signal is measured directly as an electric current by an ammeter 203. The relative intensity noise (RIN) is expressed by the equation:

$$RIN = \{(P_{total} - P_{th})/G - P_{sh}\}/(Ip^2 RB) \quad (1)$$

where $P_{total}$ is a total noise level, $P_{th}$ is a thermal noise level in the overall measurement apparatus, $P_{sh}$ is a shot noise level induced by the photo detector, Ip is a direct current (DC) of the photo detector, R is a load impedance of the photo detector 201 or an input impedance of the amplifier 204, and B is a measuring bandwidth.

$P_{total}$ and $P_{th}$ pass through the amplifier 204 and are measured by the spectrum analyzer 205. On the contrary, Ip is measured by the ammeter 203 without passing through the amplifier 204 because of a capacitor in the bias tee 202. In this situation, because the noise components and the average power of the light signal are measured separately through separate measurement paths, the measured data must be precisely compensated or calibrated so that the absolute values in the two measurements have accurate co-relationship one another.

As noted above, the prior art measurement apparatus has problems in which the correction or compensation in the measured values is inevitable to obtain the absolute values in the measuring procedure of RIN, which makes the RIN measurement complex and tedious. Moreover the resulted data tends to include errors because an error in each measuring procedure will be accumulated.

SUMMARY OF THE INVENTION

Therefore, the first object of the present invention is to provide an apparatus and a method that can automatically measure laser diode characteristics including a carrier-to-noise ratio (C/N), an optical modulation index, and a relative intensity noise (RIN) and display the resulted data in various fashions. More precisely, the apparatus and method of the present invention enables, (1) to make an automatic measurement possible, and to obtain the resulted data quickly only by pressing pushbutton switches, (2) to display the resulted data on a display such as a CRT, and to make GO/NO-GO decision possible by direct-reading on a visually display, (3) to display the resulted data of a plurality of channels or all of the channels so that the user can compare all of the data and make a necessary decision, (4) to increase the throughput of measurement or inspection process by incorporating a printer for printing the data including numerals, characters and graphs on a paper.

The mechanism and process for achieving the first object are as follows. The measurement apparatus has a photo detector for converting an input light signal to an electric current, a DC amplifier for amplifying the DC (direct current) component of the electric current from the photo detector, an analog-to-digital converter (ADC) for digitizing the output of the DC amplifier, an RF amplifier for amplifying high frequency components of the electric current, a mixer for mixing the output of the RF amplifier with the output of a local oscillator, and for generating an intermediate frequency (IF) signal, an IF amplifier for amplifying the IF signal, a detector for detecting the output of the IF amplifier, an analog-to-digital convertor (ADC) for digitizing the output of the detector, and a display device. The apparatus also has a CPU for controlling sequences of automatic measuring operations, acquiring measured data of the ADCs, and calculating the resulted laser diode characteristics based on the measured data.

By pressing a push switch for optical modulation index measurement, the apparatus starts measuring the optical modulation index automatically and displays the resulted data on the display device. A C/N measurement push switch triggers to measure the carrier-noise C/N ratio automatically and display the resulted data on the display device. A system noise push switch also triggers to measure thermal noise of system automatically and display the resulted data on the display device. Moreover, a RIN graphic display push switch triggers to measure the relative intensity noise (RIN) and display the result.

According to the first aspect of the present invention, measurement data needed for various applications of the laser diode can be obtained automatically only by pressing pushbutton switches, and the measurement data can be immediately displayed on the screen. Moreover, because the data for many channels can be displayed on the same screen, the comparison of characteristics between the channels can be easily performed. Because the measurement apparatus may incorporate a video printer or a X-Y plotter, the throughput of measurement and inspection process can be increased. Furthermore, the present invention makes the direct-reading of the RIN possible, because the measured data of each parameter is stored.

The second object of the present invention is to provide a measurement apparatus for measuring laser diode characteristics by which the correction of absolute value errors can be obviated by measuring an average signal power and a noise power in the same measurement system.

In the second aspect of the present invention, the measurement apparatus can automatically measure the relative intensity noise of the laser diode without compensating the absolute value of the measured data. The measurement apparatus has a signal converter in the vicinity of a photo detector for converting a DC signal from the photo detector to an AC signal, and a spectrum analyzer for measuring an average power and noise component of the AC signal in the same measurement path. As the signal converter, a mechanical chopper or an electrical chopper may also be used.

According to the second aspect of the present invention, the precise characteristic measurement apparatus for light emitting devices can be provided, in which the correction of absolute value errors is no longer necessary since the measurement of the average signal power and the noise power are performed in the same measurement path.

BRIEF DESCRIPTION OF THE DRAWINGS

FIG. 4 is a graphic view showing an example of C/N characteristic of many channels measured and displayed in a parallel fashion in accordance with the measurement apparatus of the present invention.

FIG. 5 is a graphic view showing an example of C/N characteristic of many channels displayed by a line chart in accordance with the present invention.

FIGS. 6A and B is a schematic chart explanatory of a multiplex communication system.

DESCRIPTION OF THE PREFERRED EMBODIMENTS

Figure 1:
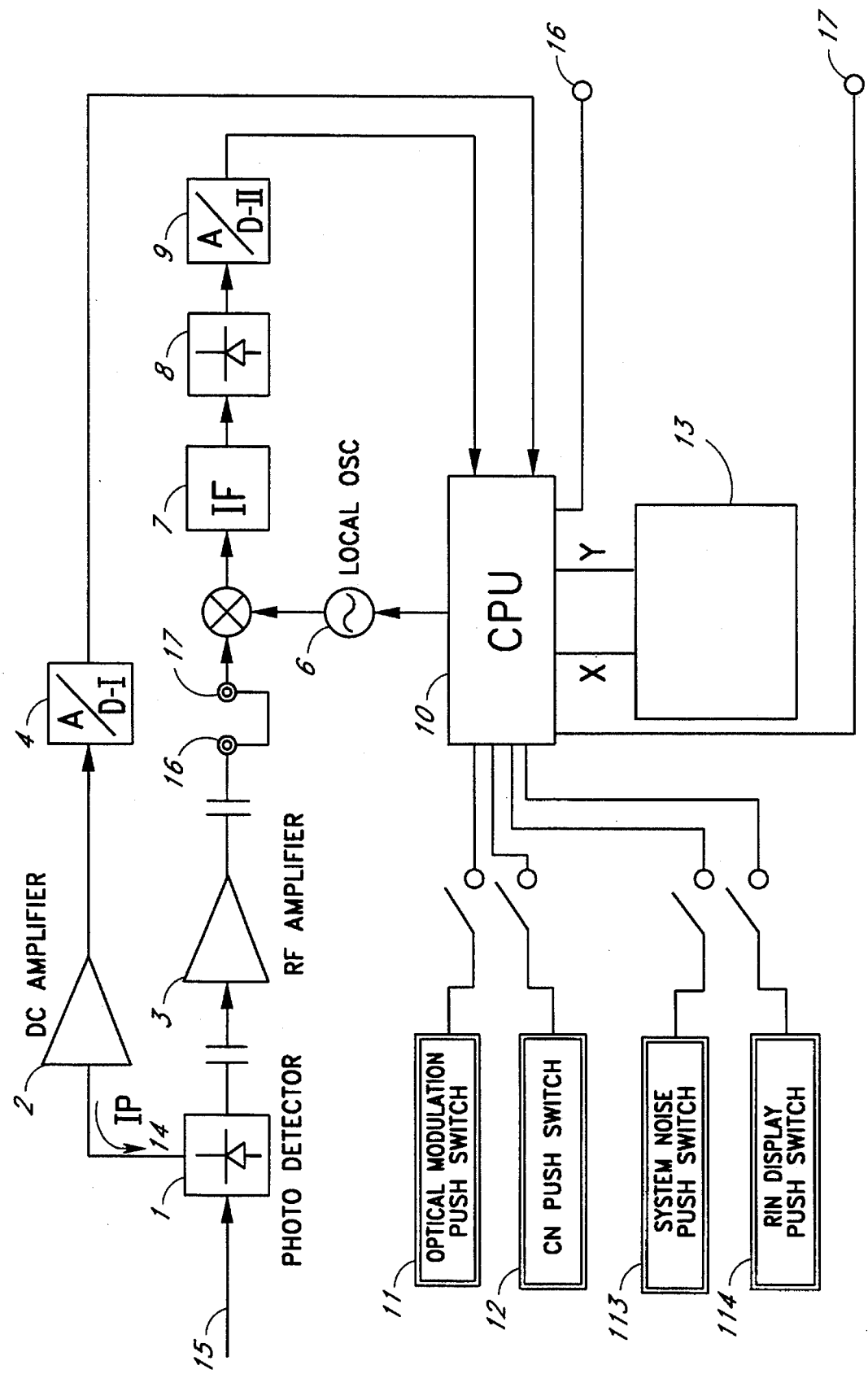
FIG. 1 is a block diagram illustrating an embodiment of the first aspect of the present invention.

An embodiment concerning the first aspect of the present invention is explained below. In FIG. 1, an measurement apparatus has a photo detector 1 for converting an input light signal 15 from a light emitting device (not shown), for example, a laser diode to an electric current, a DC amplifier 2 for amplifying a DC component of the electric current, an analog-to-digital convertor (ADC) 4 for digitizing the output of the DC amplifier 2. A CPU 10 is provided for controlling an over all operation of the measurement apparatus. The CPU 10 receives the output of the ADC 4 and processes the output with coefficients to determine an average power $P_o$ of the input light signal 15.

The measurement apparatus has an RF amplifier 3 for amplifying a high frequency component RF of the electric current from the photo diode 1, a mixer 5 for mixing the output of the RF amplifier 3 with the output of a local oscillator 6 and for generating an intermediate frequency (IF) signal, an IF amplifier 7 for amplifying the IF signal, a detector 8 for detecting the output of the IF amplifier 7, and an analog-to-digital convertor (ADC) 9 for digitizing the output of the detector 8. The CPU 10 reads the output of the ADC 9, and calculates it with coefficients to determine a modulation power $P_m$ and a noise power $P_n$.

The measurement apparatus further includes a plurality of switches 11, 12, 113 and 114 and a display 13. The switch 11 is an optical modulation index push switch to initiate the optical modulation index measurement, and the switch 12 is a C/N push switch to initiate the C/N measurement. The switch 113 is a system noise push switch to initiate the measurement of the system noise of the measurement apparatus, and the switch 114 is a RIN display push switch to initiate the measurement of the relative intensity noise of the light emitting device under test.

Figure 2A:
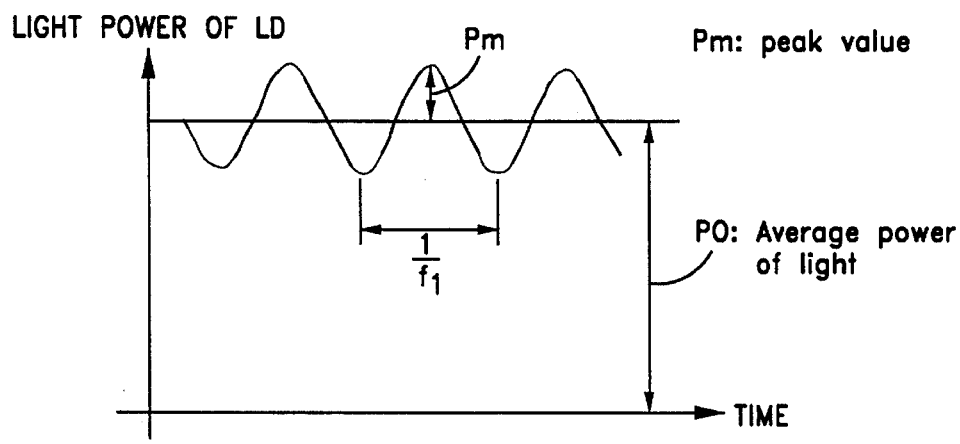
FIG. 2 is a schematic chart explanatory of a concept of optical modulation index.
Figure 2B:
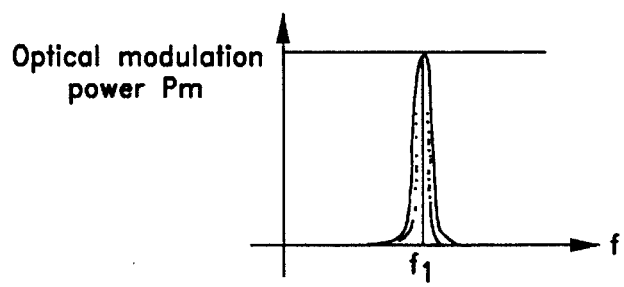

FIG. 2 is a graphic view showing a concept of optical modulation index. A carrier signal having the average power $P_o$ is amplitude modulated by a modulation signal having a frequency $f_1$ and a modulation power $P_m$. FIG. 2A shows such a modulation in a time domain while FIG. 2B shows the modulation in a frequency domain. In the situation as expressed in FIG. 2, as is well known in the art, the modulation index m is defined as $m=P_m/P_o \times 100$ (%). Pushing the optical modulation index push switch 11, the apparatus automatically proceeds to measure the optical modulation index in the above-mentioned process. The optical modulation index m is calculated by the equation as noted above and is displayed on the display device 13.

Figure 3:
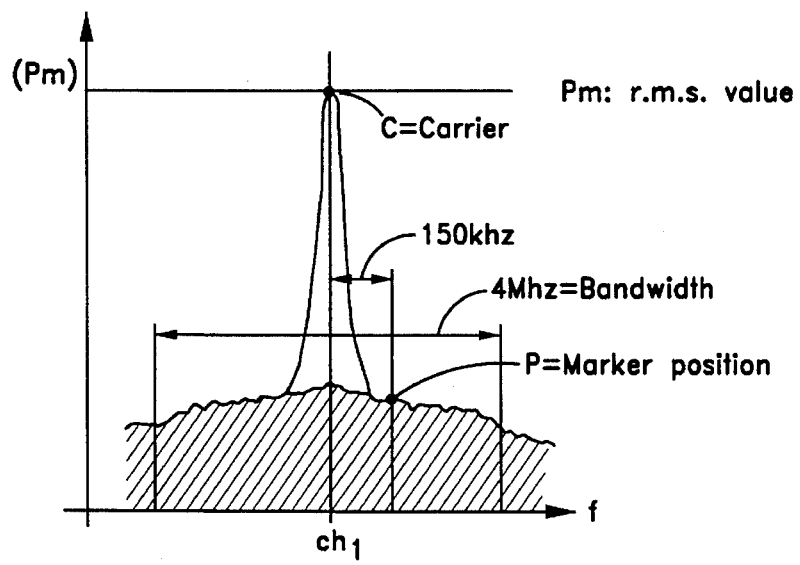
FIG. 3 is a schematic chart explanatory of a carrier-noise (C/N) ratio.

FIG. 3 is a graphic view showing a measuring concept of the carrier-to-noise C/N ratio of the light signal. The noise component $P_n$ normalized in a predetermined frequency bandwidth is measured, for example, at a position designated by a marker P which is 150 kHz off carrier as shown in FIG. 3. A total noise N is calculated by integrating $P_n$ within an arbitrary bandwidth, for example, within 4 MHz as shown in FIG. 3. In this case, N equals $P_n$ multiplied by 4 MHz. The carrier level C is measured as r.m.s. value of optical modulated signal at its center frequency as designated by a marker C in FIG. 3. Finally, the ratio C/N is calculated with N and C. By pressing the C/N push switch 12, the apparatus automatically proceeds to measure the C/N based on the above-mentioned process. The result data is displayed on the display device 13. Moreover, as shown in FIGS. 4 and 5, C/Ns of many channels are measured and displayed in a parallel fashion. These data may be displayed in the format of numerals, characters, and graphs.

By pressing the system noise push switch 113 without inputting a light signal, the CPU 10 controls the local oscillator 6 to sweep its frequency and calculates the thermal noise of $P_{th}$. Further, by pressing the RIN display push switch 114 with inputting a light signal 15, the CPU 10 controls the local oscillator 6 to sweep or to change frequency step-by-step, and receives the shot noise $P_{sh}$ from the output of the ADC 4 and the total noise $P_{total}$ from the output of the ADC 9. The CPU 10 calculates the noise component of the laser diode under test based on the following equation:

$$P_n = P_{total} - P_{th} - P_{sh} \qquad (2)$$

Figure 7:
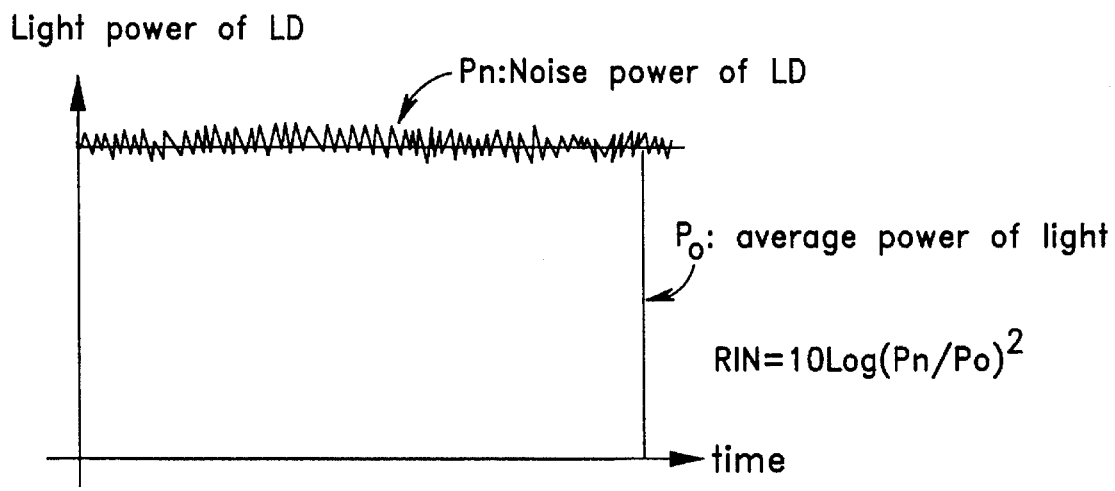
FIG. 7 is a schematic chart explanatory of relative intensity noise in a laser diode.
Figure 8:
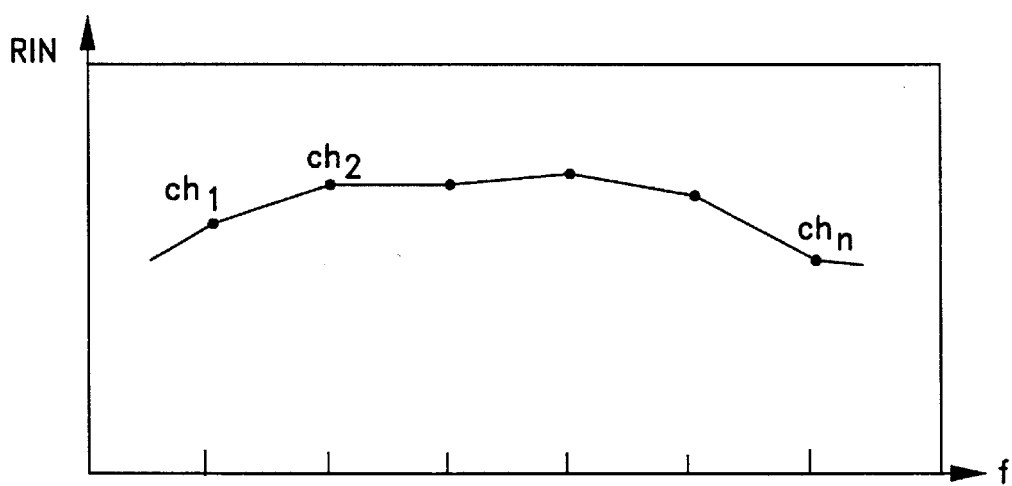
FIG. 8 is a graphic view showing other example of measured result of RIN characteristic of many channels displayed in a parallel fashion.

Finally, the CPU 10 calculates RIN by the equation:

$$RIN = 10 \log (P_n/P_o)^2 \qquad (3)$$

where Po is average optical power that is measured in the above-mentioned process. The conceptual illustration for this relationship is shown in FIG. 7. An example the result data is displayed on the display device 13 as shown in FIG. 8.

Terminals 16 and 17 in FIG. 1 are provided to connect to other measurement devices such as a video printer or a X-Y plotters. According to the first aspect of the present invention, the measurement data needed for various applications of the laser diode can be obtained automatically only by pushing push-button switches, and the measurement data can be immediately displayed on the screen. Moreover, because the data for many channels can be displayed on the same screen, the comparison of characteristic between the channels can be easily performed. Because the measurement apparatus may incorporate a video printer or a X-Y plotter, the throughput of measurement and inspection process can be increased. Furthermore, the present invention makes the direct-reading of the RIN possible, because the measured data of each parameter are stored.

Figure 9:
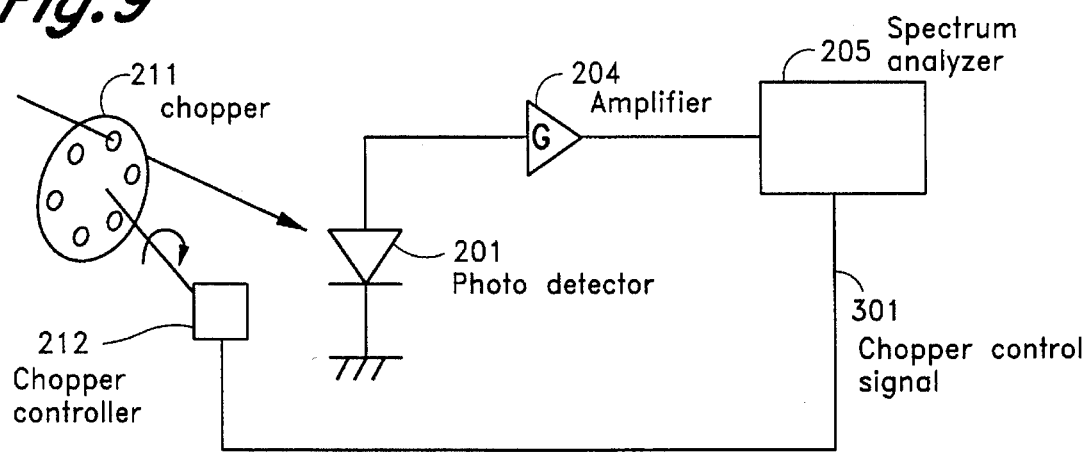
FIG. 9 is a block diagram illustrating an embodiment of the second aspect of the present invention.

An embodiment concerning the second aspect of the present invention is explained below. In FIG. 9, a chopper 211 is provided in front of a photo detector 201. The chopper 211 is composed of a disk with slits for light and a stepping motor. As the disk rotates, the incident light is intermitted periodically. A chopper controller 212 generates a chopper control signal 301 to control the movement of the chopper 211. The chopper control signal 301 is also supplied to a spectrum analyzer 205 for transmitting information regarding the ON-OFF states of the chopper 211.

Figure 11:
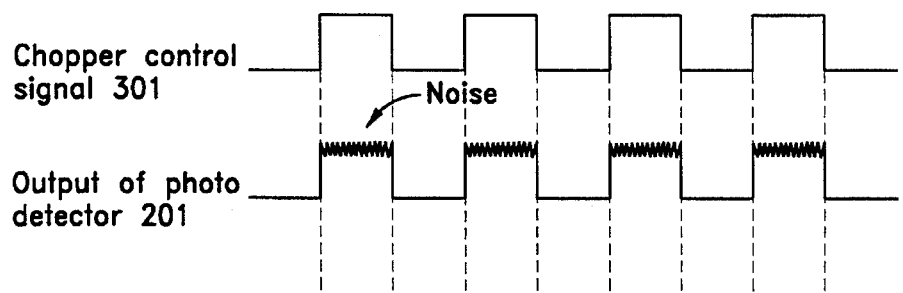
FIG. 11 is a timing chart showing an operation of the invention in FIGS. 9 and 10.
Figure 12:
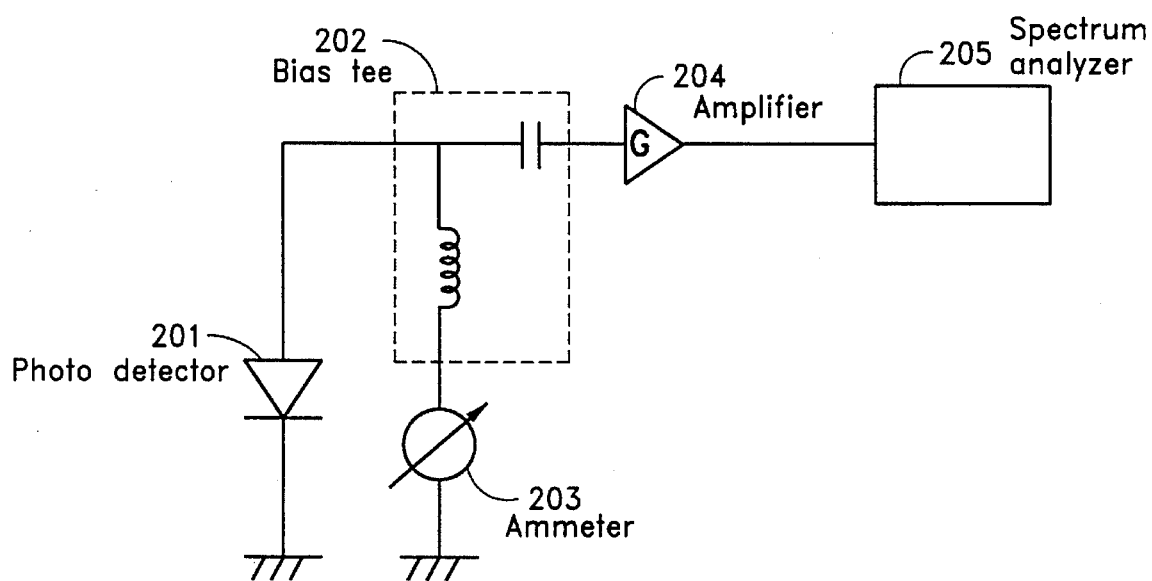
FIG. 12 is a block diagram illustrating a prior art measurement apparatus.

The incident light to the photo detector 201 is intermitted by the chopper 211. FIG. 11 shows a timing chart of the chopper control signal 301 and the output of the photo detector. When the chopper control signal 301 is OFF, the output of the photo detector 201 is a thermal noise of the measuring system. When the chopper control signal 301 is ON, the output of the photo detector 201 is a light-induced current which is proportional to the intensity of the input light signal. The light-induced current is superimposed by noise as shown in FIG. 11.

In this embodiment of the invention, the relative intensity noise RIN is expressed as:

$$RIN = (P_{total} - P_{th} - P_{sh})/\{Gk_{fo}Ip^2(fo)RB\} \qquad (4)$$

where $k_{fo}$ is a correction coefficient when average power of signal is measured by chopping it at frequency fo.

The measurement process in accordance with this embodiment is as follows. First, the average power of signal corresponding to $Ip^2(fo) R$ is measured by the spectrum analyzer 205 at frequency fo. Then, the noise power is measured by the spectrum analyzer 205 with its gated-sweep function. By this function, the spectrum analyzer 205 can sweep frequency only when the chopper control signal 301 is ON and can easily measure noise power. As mentioned above, the measurements are performed in the same measurement path. Therefore, the RIN can be obtained precisely without correcting absolute value errors. The absolute value errors are counterbalanced in the form of ratio in the equation of RIN.

Figure 10:
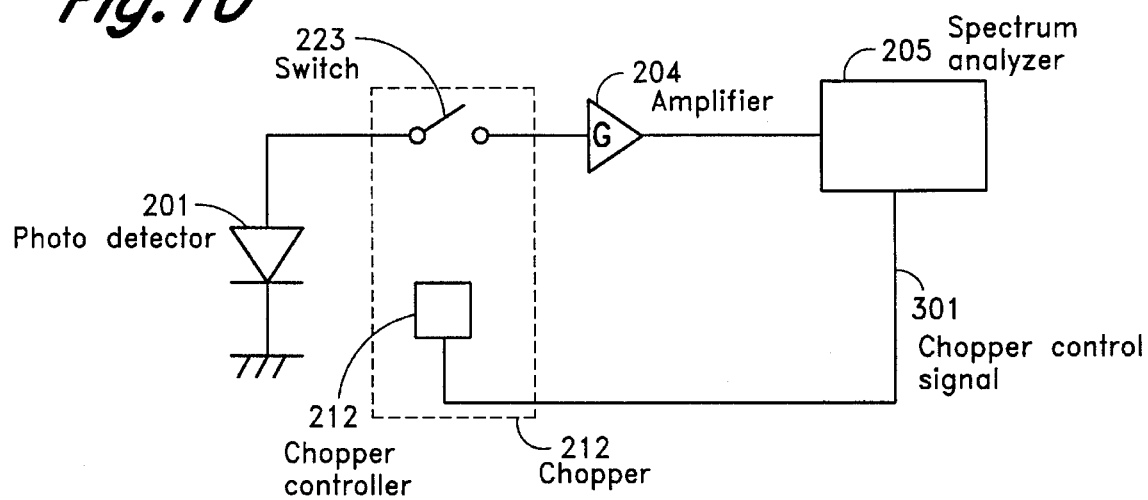
FIG. 10 is a block diagram illustrating another embodiment of the second aspect of the present invention.

Next, another embodiment concerning the second aspect of the present invention is explained. FIG. 10 shows an example of such an embodiment where the chopper is made of an electric circuit. A chopper 221 is provided next to the photo detector 201. The chopper 221 is composed of a switch 223 and a chopper controller 222. The chopper controller 222 controls the switch 223 and generates a chopper control signal 301. The chopper control signal 301 is connected to a spectrum analyzer 205 for transmitting ON-OFF states of the chopper 221.

The light-induced current of the photo detector 201 is intermitted by the chopper 221. When the chopper control signal 301 is OFF, the output of the chopper 221 is also OFF. On the contrary, when the chopper control signal 301 is ON, the output of the chopper 221 is a light-induced current. The light-induced current is superimposed by the noise as shown in the timing chart of FIG. 11. In this embodiment of the invention, the RIN is expressed exactly the same as equation (4).

According to the present invention, the precise characteristic measurement apparatus for light emitting devices can be provided, in which the correction of absolute errors is no longer necessary since the measurement of the average signal power and the noise power are performed in the same measurement path.

We claim:

1. A measurement apparatus for evaluating a light emitting device, comprising:

a photo detector for converting an input light signal from a light emitting device to an electric current;

a DC amplifier for amplifying a DC component in said electric current from said photo detector;

a first analog-to-digital convertor for digitizing an output of said DC amplifier;

an RF amplifier for amplifying a high frequency component in said electric current;

a detector for detecting an output of said RF amplifier;

a second analog-to-digital convertor for digitizing an output of said detector;

a controller for controlling sequences of automatic measuring operations, for reading measured data from said first and second analog-to-digital convertors, and for calculating said measured data for determining characteristics of said light emitting device;

a display device, coupled to said controller, for displaying said characteristics of said light emitting device.

2. A measurement apparatus as defined in claim 1, wherein said apparatus further includes first and second push-button switches, coupled to said controller, for triggering said apparatus to automatically measure a carrier-to-noise ratio and an optical modulation index of said light emitting device based on said measured data.

3. A measurement apparatus as defined in claim 2, wherein said apparatus further includes a third push-button switch, coupled to said controller, for triggering said apparatus to automatically measure a relative intensity noise of said light emitting device.

4. A measurement apparatus as defined in claim 3, wherein said apparatus further includes a fourth push-button switch, coupled to said controller, for triggering said apparatus to automatically measure system noise without providing an input light signal to said apparatus.

5. A measurement apparatus as defined in claim 3, wherein said apparatus further includes:

a mixer for mixing an output of said RF amplifier with an output of a local oscillator and for generating an intermediate (IF) signal having a frequency determined by a difference between said high frequency component and said local oscillator; and an IF amplifier for amplifying said IF signal from said mixer.

6. A method for measuring characteristics of a light emitting device, comprising the steps of:

converting an input light signal from a light emitting device to an electric current by a photo detector;

amplifying a DC component in said electric current from said photo detector by a DC amplifier;

converting an output of said DC amplifier to a first digital signal;

amplifying a high frequency component in said electric current by an RF amplifier;

detecting an output of said RF amplifier by a detector;

converting an output of said detector to a second digital signal;

reading said first and second digital signals and calculating said first and second digital signals to determine characteristics of said light emitting device; and displaying said characteristics of said light emitting device on a display.

* * * * *